United States Patent
Johnson (10) Patent No.: US 8,976,830 B2
(45) Date of Patent: Mar. 10, 2015

(54) LASERS WITH GAPSB BARRIER LAYERS

(71) Applicant: Finisar Corporation, Sunnyvale, CA (US)

(72) Inventor: Ralph H. Johnson, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 13/801,444

(22) Filed: Mar. 13, 2013

(65) Prior Publication Data

US 2014/0269802 A1 Sep. 18, 2014

(51) Int. Cl.
*H01S 5/00* (2006.01)
*H01S 5/343* (2006.01)

(52) U.S. Cl.
CPC ................................. *H01S 5/34346* (2013.01)
USPC ...................................................... 372/45.01

(58) Field of Classification Search
CPC ..... H01S 5/34346; H01S 5/20; H01S 5/2223; H01S 5/309

USPC .......................................................... 257/194

See application file for complete search history.

(56) References Cited

U.S. PATENT DOCUMENTS 6,898,224 B2 * 5/2005 Yokozeki et al. .......... 372/49.01
2005/0094692 A1 * 5/2005 Kim ................................ 372/43

* cited by examiner

*Primary Examiner* — Tuan Nguyen
(74) *Attorney, Agent, or Firm* — Maschoff Brennan (57) ABSTRACT

A laser active region can include a quantum well barrier having GaPSb. The active region can include one or more quantum wells, and a quantum well barrier having GaPSb bounding each side of each of the one or more quantum wells. The quantum well barrier can be $GaP_{1-w}Sb_w$, where w ranges from about 0.12 to about 0.25 mole fraction, and can have a thickness of from about 20 Angstroms to about 50 Angstroms. The one or more quantum wells include InGaAs or InGaAsP. Various types of lasers can have the laser active region. Such a laser can be capable of emitting light having a wavelength of about 850 nm or +/−150 nm. As an example, a vertical cavity surface-emitting laser (VCSEL) having the laser active region. The laser may also be a tunneling laser.

19 Claims, 9 Drawing Sheets

| NM | Composition | | N-Dopant | P-Dopant | |
|---|---|---|---|---|---|
| 2 | AlGaAs | 0.92 | 2.00E+18 | | AlGaAs |
| 20 | AlGaAs | 0.16 | 2.00E+18 | | Compositional Ramp |
| 34 | AlGaAs | 0.16 | 2.00E+18 | | Compositional Ramp |
| 10 | AlGaAs | 0.25 | 3.50E+18 | | Begin Lattice Matched InGaP 3.5e18 Dopant |
| 14.69 | | 3.28 | | | Lattice Matched InGaP 1e18 Dopant |
| 14.69 | | 3.28 | | | Compressive In55Ga45P Undoped |
| 14.69 | | 3.28 | | | 50 % GaAsP Barrier |
| 5 | | 3.4 | | | In17Ga83As87P13 Quantum Well |
| 4 | | 4 | | | 50 % GaAsP Barrier |
| 4 | | 3.4 | | | 0-35 % Al, Matched, AlInGaP |
| 10 | | 3.1 | | | Upper Confining |
| 37 | AlGaAs | 0.9 | | 6E+18 | Compositional Ramp |
| 20 | AlGaAs | 0.16 | | 1.00E+18 | Spacer |
| 28 | AlGaAs | 0.16 | | 5E+17 | |

Fig. 8

| NM | | Composition | N-Dopant | P-Dopant | |
|---|---|---|---|---|---|
| 23.25 | AlGaAs | 0.15 | 2.00E+18 | | 10 n Light |
| 10 | AlGaAs | 0.25 | 3.50E+18 | | Compositional Ramp |
| 14.69 | | 3.28 | | | Lattice Matched InGaP 2e18 Dopant |
| 14.69 | | 3.28 | | | Lattice Matched InGaP 1e18 Dopant |
| 14.69 | | 3.28 | | | Compressive In.55GaP Undoped |
| 2.825 | | 3.4 | | | GaP.8Sb.2 Barrier |
| 3.67 | | 4 | | | In1Ga9As Quantum Well |
| 2.825 | | 3.28 | | | GaP.8Sb.2 Barrier |
| 4 | | 3.28 | | 1.40E+18 | 0-15% CR, Al, Matched AlInGaP |
| 6 | | 3.28 | | 6.00E+18 | 15-30% Al, Match, AlInGaP Be-doped |
| 31.5 | AlGaAs | 0.92 | | 5.00E+18 | Compositional Ramp |
| 20 | AlGaAs | 0.15 | | 5.00E+17 | |
| 37.75 | AlGaAs | 0.15 | | | |

*Fig. 9*

LASERS WITH GAPSB BARRIER LAYERS

BACKGROUND

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers out put a high optical output representing binary highs and a lower power optical output representing binary lows. To obtain quick reaction time, the laser is constantly on, but varies from a high optical output to a lower optical output.

Optical networks have various advantages over other types of networks such as copper wire-based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface-Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g., a p-type mirror and an n-type mirror). Notably, the notion of top and bottom mirrors can be somewhat arbitrary. In some configurations, light could be extracted from the wafer side of the VCSEL, with the "top" mirror nearly totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current the injected minority carriers form a population inversion in the quantum wells that produces optical gain. Optical gain occurs when photons in the active region stimulate electrons in the conduction band to recombine with holes in the valence band which produces additional photons. When the optical gain exceeds the total loss in the two mirrors, laser oscillation occurs.

The active region may also include an oxide aperture formed using one or more oxide layers formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to "lase" as the optically coherent photons are emitted from the top of the VCSEL.

The subject matter claimed herein is not limited to embodiments that solve any disadvantages or that operate only in environments such as those described above. Rather, this background is only provided to illustrate one example technology where some embodiments described herein may be practiced.

SUMMARY

In one embodiment, a laser active region can include a quantum well barrier having GaPSb. As such, the active region can include one or more quantum wells, and a quantum well bather having GaPSb bounding each side of each of the one or more quantum wells. In one aspect, the quantum well bather is $GaP_{1-w}Sb_w$, where w ranges from about 0.12 to about 0.25 mole fraction. In one aspect, w is about 0.2 mole fraction. In one aspect, the quantum well bather has a thickness of from about 20 Angstroms to about 50 Angstroms. In one aspect, the quantum well barrier thickness is about 31 Angstroms. In one aspect, the one or more quantum wells include InGaAs. In one aspect, the one or more quantum wells include InGaAsP. Various types of lasers can have the laser active region. Such a laser can be capable of emitting light having a wavelength of about 850 nm or +/−150 nm. As an example, a vertical cavity surface-emitting laser (VCSEL) having the laser active region. The laser may also be a tunnel injection laser.

In one embodiment, a laser can include: one or more quantum wells having InGaAs; and a quantum well bather having GaPSb bounding each side of each of the one or more quantum wells. In one aspect, the one or more quantum wells have at least a trace of P. The laser can include: a n-doped confining region operably coupled with a first side of an active region having the one or more quantum wells and quantum well barriers, the n-doped confining region having InGaP; and a p-doped confining region operably coupled to a second side of the active region and having AlInGaP. In one aspect, the p-doped confining region includes a compositional ramp confining region adjacent to the active region and a compositional consistent confining region on the other side of the compositional ramp confining region.

In one embodiment, a method of manufacturing a laser active region can include: growing the GaPSb quantum well barrier using a non-equilibrium technique with a group V/III element ratio, growth temperature and growth rate sufficient that the group V elements are held in place without the GaPSb segregating into separate phases with different P to Sb ratios.

In one aspect, the GaPSb quantum well bather is grown to have one or more of: $GaP_{1-w}Sb_w$, where w ranges from about 0.12 to about 0.25 mole fraction; or a thickness of from about 20 Angstroms to about 50 Angstroms.

DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present invention includes a laser active region with quantum well barrier layers that include GaPSb. The quantum wells in the active region can include InGaAs and/or InGaAsP. In some instances, either the P or Sb or both can be present in a low or trace amount, which can sometimes be chemically referred to as InGaAs(P)(Sb) as described herein to particularly designate P or Sb as being a low or trace amount. The laser active region can be configured as any of a variety of lasers, such as vertical cavity surface-emitting lasers (VCSEL), other surface-emitting lasers, edge-emitting lasers, pump lasers, or the like. While embodiments of a VCSEL are shown in the figures, the active region described herein can be adapted and implemented in these other types of lasers. The lasers include semiconductor devices that have active regions, confining regions, and other regions as described herein and generally known in the art. In addition, quantum well electro-optic or electro-absorption modulators can be made with these combinations of layers.

The semiconductor devices of the present invention can be manufactured from any type of semiconductor. Examples of suitable materials include III-V semiconductor materials (e.g., prepared from one or more Group III material (boron (B), aluminum (Al), gallium (Ga), indium (In), thallium (Tl)) and one or more Group V materials (nitrogen (N), phosphorus (P), arsenic (As), antimony (Sb), bismuth (Bi)) and optionally some type IV materials. Particularly, the quantum wells, quantum well barriers, and confining regions can include these materials and main materials. Transition layers or wings separating the quantum wells and quantum well barriers, if included, may also include these materials. However, select regions or layers can be doped as described herein or in the incorporated references or known in the art.

In one embodiment, some elements (e.g., P in the $In_yGa_{1-y}As_{1-z}P_z$ quantum wells or the Al in the n-doped electrical confining layer or n-side injection layer) can be present in low amounts or traces. Low amounts can be less than 5% or less than 1% or less than 0.75%, or less than 0.5%. Traces can be less than 0.25%, or less than 0.1%, or less than 0.075%, or less than 0.05%, or on the border of being measurable. For example, trace amounts of an element can be from an artifact in manufacturing, such as residue or when an element floats to the surface of one layer and thereby may be included in the next above adjacent layer or interlayer diffusion of the element. When an element is present as a trace in a layer or region, it may indicate that the element was not affirmatively added to that layer or region, but became present due to an artifact of manufacturing.

The semiconductor device can include an active region having one or more quantum wells and two or more quantum well bathers. The quantum wells and quantum well barriers can be adjacent to each other or optionally separated by one or more transitional layers or wings therebetween. The optional transitional layers may also be referred to as interfacial layers as they are located at the interface between the quantum wells and quantum well barriers and may be ramps of gradients changing from the composition of the well to the composition of the barrier. In one aspect, the quantum wells are physically adjacent and connected with the quantum well barriers, and thereby the active region is devoid of transitional layers, which can be preferred in some instances.

Electrical confining regions can sandwich the active region and provide optical gain efficiency by confining carriers to the active region. One of the confining regions (e.g., n-doped) can have no Al or low amounts of Al, which low amounts of Al can be lower than traditional confining regions. The no Al or low Al confining region can be an n-doped (e.g., n-side) injection region or layer. For example, a lower confining region (e.g., n-doped) can have Al between 0 and 0.35 mole fraction and an upper confining region (e.g., p-doped) can have Al between 0.2 and 0.4 mole fraction. The electrical confining regions can be configured as and function as portions of mirrors or they may be separate regions between the mirrors and the active region. The low or no Al confining region (e.g., lower confining region) can be n-doped, and may also be referred to as an injection region or injection layer.

In one embodiment, the lower confining region with no or low Al that is n-doped can be InGaP.

In one embodiment, above the upper confining layer (e.g., p-doped) can be an AlInGaP region with Al between 0.1 and 0.45 mole fraction, which may provide a high energy band gap. The aluminum content can be selected to give the material a relatively wide band gap, as compared to the band gap in the quantum well barriers of the active region. The wide band gap material can give the confining region good carrier confinement and increase the efficiency in the active region. In an exemplary embodiment, the high aluminum AlInGaP region may also be doped with a p-type dopant. The higher aluminum or p-side confining layer can be graded.

In one embodiment, above the upper confining layer (e.g., p-type) can be an AlGaAs region with Al between 0.45 and 1 mole fraction, which may provide a high energy band gap. The aluminum content can be selected to give the material a relatively wide band gap, as compared to the band gap in the quantum well barriers of the active region. The wide band gap material can give the confining region good carrier confinement and increase the efficiency in the active region. In an exemplary embodiment, the high aluminum AlGaAs region may also be doped with a p-type dopant. The higher aluminum or p-side confining layer can be graded.

The lasers of the present invention can have quantum wells that include InGaAs, InGaAs(P)(Sb), and/or InGaAsP quantum wells with GaPSb quantum well bathers or GaAsP quantum well barriers. That is, the quantum well barriers in the active region can include GaPSb. The Sb can be present in an amount of about 20% and can be about 37 Angstroms thick. However, the Sb percentage and thickness can be varied within a reasonable range, such as described herein.

In one embodiment, the active region can include an $In_xGa_{1-x}As_{1-y}P_y$ quantum well, where x represents the group III mole fraction of In in a quantum well and can range from about 0.07 to about 0.3, or about 0.1 to about 0.25, or about 0.12 to about 0.2, or optimally about 0.14; and y represents the group V mole fraction of P in a quantum well and can range from about 0 to about 0.25, or about 0.05 to 0.2, or about 0.1 to 0.16, or optimally about 0.1. In one aspect, x is 0.1 and y is 0. As used herein, the mole fractions represent the percentages used, where the mole fraction can be multiplied by 100 to obtain the percentage. The mole fraction amount of Ga can be calculated by 1−x and the mole fraction of As can be calculated by 1−y.

The quantum well can have a thickness that ranges from about 30 Angstroms to about 80 Angstroms, or about 35 Angstroms to about 60 Angstroms, or about 35 Angstroms to about 50 Angstroms, or optimally about 37 Angstroms.

In one embodiment, the one or more quantum wells can have a composition $In_xGa_{1-x}As_{1-y}P_y$ according to Equation 1: y=0.0018567*QW+1.18*x−0.14373. Here, QW is the width of the quantum well; x is mole fraction of In; and y is mole fraction of P or +/−0.1 or 0.5 thereof. In one aspect, x is about 0.14 or +/−0.1 or 0.05 mole fractions thereof; and QW is about 40 Angstroms or +/−15, 10, or 5 Angstroms thereof. Also, Equation 1 can be expressed as Equation 1A: y=1.03627+(0.0018567*QW−1.18*(1−x)).

In view of Equation 1, when QW is 40 Angstroms and x is 0.14 then y is 0.096, when QW is 30 Angstroms and x is 0.14 then y is 0.077, when QW is 50 Angstroms and x is 0.14 then y is 0.114, when QW is 40 Angstroms and x is 0.1 then y is 0.0485, when QW is 40 Angstroms and x is 0.2 then y is 0.167, when QW is 50 Angstroms and x is 0.1 then y is 0.67, when QW is 30 Angstroms and x is 0.2 then y is 0.148, when QW is 50 Angstroms and x is 0.2 then y is 0.185, when QW is 30 Angstroms and x is 0.1 then y is 0.03.

In one embodiment, the active region can include $GaAs_{1-z}P_z$ quantum well barriers, where z represents the group V mole fraction of P in a quantum well barrier and can range from about 0.3 to about 0.60, or about 0.35 to about 0.55, or about 0.40 to about 0.5, or about 0.45. The mole fraction amount of As can be calculated by 1−z. When the quantum well barriers include $GaAs_{1-z}P_z$, Equation 1 can be used to calculate the quantum well parameters.

In one embodiment, the active region can include $In_vGa_{1-v}As_{1-z}P_z$ quantum well barriers, where v represents the group III mole fraction of In in a quantum well barrier and can range from about 0 to about 0.25, or about 0 to about 0.015, or about 0 to about 0.06, or optimally about 0; where z represents the group V mole fraction of P in a quantum well barrier and can range from about 0.3 to about 0.60, or about 0.35 to about 0.55, or about 0.40 to about 0.5, or about 0.45. The mole fraction amount of Ga can be calculated by 1−v and the mole fraction amount of As can be calculated by 1−z. When the quantum well barriers include $In_vGa_{1-v}As_{1-z}P_z$, Equation 1 can be used to calculate the quantum well parameters.

The quantum well barrier having $GaAs_{1-z}P_z$ or $In_vGa_{1-v}As_{1-z}P_z$ can have a thickness that ranges from about 30 Angstroms to about 60 Angstroms, or about 35 Angstroms to about 55 Angstroms, or about 40 Angstroms to about 50 Angstroms, or optimally about 45 Angstroms.

In one embodiment, the active region can include $GaP_{1-w}Sb_w$ quantum well barriers, where w represents the group V mole fraction of Sb in a quantum well barrier and w can range from about 0.12 to about 0.25, or about 0.15 to about 0.24, or about 0.17 to about 0.23, or about 0.2. The mole fraction amount of P can be calculated by 1−w. When the quantum well barrier includes $GaP_{1-w}Sb_w$, the $In_xGa_{1-x}As_{1-y}P_y$ quantum wells can include the parameters described herein and may be calculated by Equation 1.

The quantum well bather having $GaP_{1-w}Sb_w$ can have a thickness that ranges from about 20 Angstroms to about 50 Angstroms, or about 22 Angstroms to about 40 Angstroms, or about 25 Angstroms to about 35 Angstroms, or optimally about 31 Angstroms.

Figure 3:
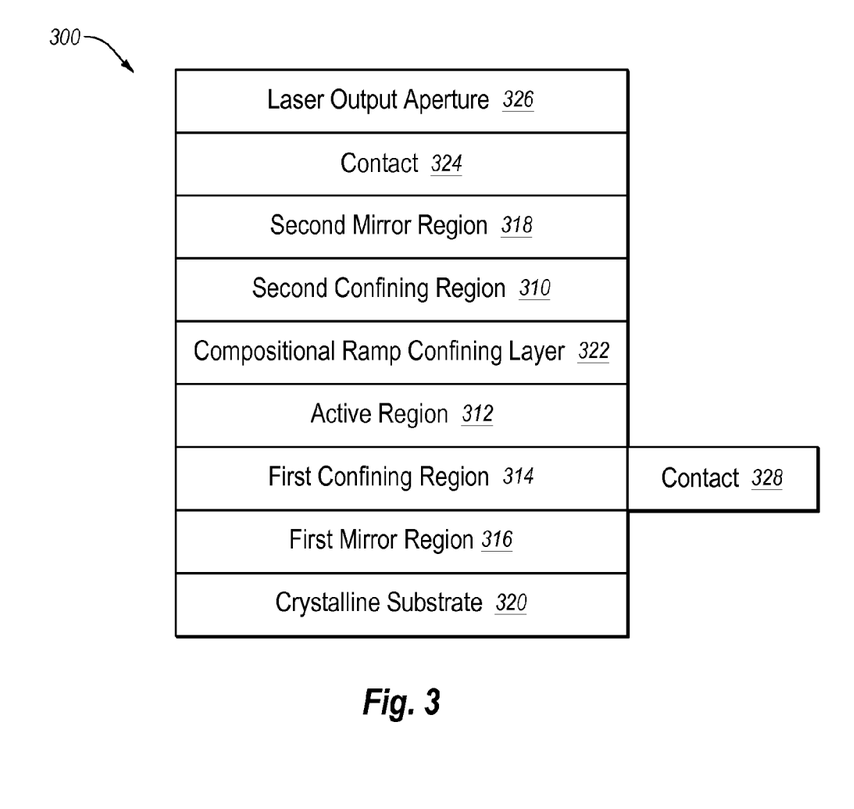
FIG. 3 is a schematic of an embodiment of a VCSEL layered semiconductor operating environment.

In one embodiment, a laser can include an active region having one or more quantum wells having InGaAsP. Embodiments having 1-3 quantum wells can be used for most types of lasers described herein, but can be especially suitable for edge-emitting lasers or pump lasers. Embodiments having 2-8 quantum wells can be used for high speed VCSELs lasers, where 3 quantum wells can be optimal in some instances (e.g., QW width is 40 Angstroms and x is 0.14 mole fractions), and 5 quantum wells can be useful as shown in FIG. 3 described below. However, more than 8 quantum wells can be used in some instances.

In one embodiment, a laser can include an active region having two or more quantum well barriers having GaAsP or GaPSb bounding the one or more quantum wells. That is, each quantum well has a first surface and an opposite second surface, and the active region includes a quantum well barrier on each surface. As such, the number of quantum well bathers is equal to the number of quantum wells plus 1. For example, a 3 quantum well (QW) active region embodiment includes 4 quantum well bathers (B) arranged as: B-QW-B-QW-B-QW-B. While less preferred, design considerations can allow for the active region to have the same number of quantum wells and barriers, where one quantum well is on an edge of the active region.

In one embodiment, the active region is devoid of Al. That is, the quantum wells can be devoid of Al. Also, the quantum well barriers can be devoid of Al. However, trace amounts of Al may be included in the active region, such as when not affirmatively introduced, which can be by incidental Al from processing and manufacturing. Such incidental Al can be found in the barriers. Preferably, the active region is entirely devoid of Al, but some trace amounts may be acceptable. For example, a barrier may include a trace amount of Al when the barrier is adjacent to a region or layer, such as a confining or injection region having Al, where the Al floats on the surface of an Al-containing layer and thereby becomes incorporated into the barrier formed thereon. Here, the Al is usually present in a trace amount and is not affirmatively added to the barrier. This floating phenomenon may also result in a quantum well having a trace amount of Al, as the Al is not affirmatively added to the quantum well.

In one embodiment, the laser emits light having 850 nm or +/− about 150, 100, 75, 70, 60, 50, 42, 40, 30, 25, 20, 15, 10, or 5 nm. In one aspect, the laser is about 850 nm. In another aspect, the laser is about 808 nm. In another aspect, the laser is about 780 nm. In one aspect, the laser is less than about 1150 nm, or less than about 980 nm, or less than about 850 nm. In one aspect, the laser emits light having about 850 nm or about 70, 60, 50, 42, 40, 30, 25, 20, 15, 10, or 5 nm less than 850 nm (e.g., not greater than about 850 nm).

In one embodiment, the laser can include a first confining region (e.g., n-doped confining region) which can be an injection region operably coupled with a first side of the active region and having $Al_r In_{1-r-q} Ga_q P$ or digital alloy thereof. In one aspect, the n-doped confining region can be $In_{1-q} Ga_q P$. For example, r ranges from about 0 to about 0.35, or from about 0.1 to about 0.3, or about 0.15 to about 0.25, or about 0.15. However, the r can range from 0 to 0.15, where about 0 can be beneficial and improved over 0.15, and a specific example is 0.05. For example, 0.15 cause a small barrier to tunnel and 0 can be a larger barrier to tunnel, and the r can be therebetween. The tunneling from the first confining layer through the barrier into the quantum wells can occur in some configurations, which results in the laser being considered a tunneling injection laser, which can be beneficial and is considered the optimal configuration with barrier thicknesses of about 31 Angstroms and r about 0.

In one embodiment, for the n-doped confining region $Al_r In_q Ga_{1-q} P$ or $In_q Ga_{1-q} P$ or digital alloy thereof q ranges from about 0.4 to about 0.6, or from about 0.45 to about 0.6, or about 0.51. The Al mole fraction is kept low or is absent in order to enhance carrier capture into the wells, and to reduce carrier relaxation heating. The lower Al or no Al can allow for the first confining region to function as a tunnel injection contact.

The first confining region can be adjacent to the active region, or one or more layers can be located therebetween. The first confining region can include one or more appropriate electrically confining layers commonly employed in lasers. Optionally, a nominally undoped layer can be included between the active region and first confining region. By being nominally undoped, some doping may be allowed, but it may also be completely undoped. In one aspect, the first confining region can be n-doped. When doped, the n-dopant can be any n-type dopant, such as Si or Te or the like. The dopant can be used in only a portion of the first confining region. As such, the first confining region can include one or more layers that are undoped and/or one or more regions that are n-doped. For example, an undoped layer can be adjacent to the active region and an n-doped layer can be adjacent to the undoped layer opposite of the active region. In another aspect, the first confining region can be a lower confining region. In another aspect, the first confining region can be lattice matched with a GaAs substrate. In another aspect, the first confining region can be on top of the GaAs substrate. In another aspect, the first confining region can be lattice matched to any adjacent region or layer, such as a mirror region located between the first confining region and the GaAs substrate.

In one embodiment, a first mirror region can be located between the GaAs substrate and the first confining region. The first mirror region can be an AlGaAs mirror, as described herein or generally known in the art, which AlGaAs mirror can have mirror periods.

In one embodiment, the laser can include a second confining region (e.g., p-doped) operably coupled to a second side of the active region and having $Al_s In_t Ga_{1-t-s} P$ or digital alloy thereof. For example, s ranges from about 0 to about 0.5, or from about 0.1 to about 0.3, or from about 0.15 to about 0.4, or from about 0.2 to about 0.35, or about 0.25. When s is about 0.25, forward voltage has been found to be optimal. For example, t ranges from about 0.4 to about 0.6, or from about 0.44 to about 0.54, or from about 0.47 to about 0.53, or about 0.51. In another example, t can be chosen so as to nominally lattice match the GaAs substrate at about 0.51.

In one embodiment, the laser can include a second confining region (e.g., p-doped) operably coupled to a second side of the active region and having a compositional ramp confining layer and compositional consistent confining layer, both having $Al_s In_t Ga_{1-t-s} P$ or digital alloy thereof. The compositional ramp confining layer can be adjacent to the active region, where the compositions ramps from the barrier layer of the active region to the compositional consistent confining layer. For example, in the compositional ramp confining layer s ranges from about 0 to about the same for the compositional consistent confining layer described below. For example, in the compositional consistent confining layer s ranges from about 0.15 to about 0.5, or from about 0.2 to about 0.45, or from about 0.25 to about 0.4, or from about 0.28 to about 0.39, or about 0.35. When s in the compositional consistent confining layer is about 0.35, forward voltage and electron confinement have been found to be optimal. For example, t ranges from about 0.4 to about 0.6, or from about 0.44 to about 0.54, or from about 0.47 to about 0.53, or about 0.51.

In one embodiment, the p-doped confining region having $Al_s In_t Ga_{1-t-s} P$, and t ranges from about 0.4 to about 0.6, or about 0.44 to about 0.54, or about 0.47 to about 0.53, or about 0.51. This second confining layer may be constructed from a digital alloy of other compounds which average in the specified ranges. This second confining region can be adjacent to the active region, or one or more layers can be located therebetween. The second confining region can include one or more appropriate electrically confining layers commonly employed in lasers. Optionally, a nominally undoped or slightly p-doped layer can be included between the active region and second confining region. In one aspect, the second confining region can be p-doped. When doped, the p-dopant can be any p-type dopant, such as Be, Mg, Zn, or the like. The dopant can be used in only a portion of the second confining region. As such, the second confining region can include one or more layers that are undoped and/or one or more regions that are p-doped. For example, an undoped layer can be adjacent to the active region and a p-doped layer can be adjacent to the undoped layer opposite of the active region. However, the p-doped layer can be adjacent to the active region in some instances. In another aspect, the second confining region can be an upper confining region. In another aspect, the second confining region can be lattice matched with a GaAs substrate.

In one embodiment, a p-doped $Al_u Ga_1 As$ region can be associated with the second confining region opposite of the active region. For example, u can range from about 0.4 to about 1, or from about 0.60 to about 1, or from about 0.75 to about 1, or about 0.92. Also, the p-doping can be from about $5*e^{17}/cm^3$ to $8*e^{18}/cm^3$, or from about $1*e^{18}/cm^3$ to $7*e^{18}/cm^3$, or from about $3*e^{18}/cm^3$ to $6*e^{18}/cm^3$, or about $5*e^{18}/cm^3$. This $Al_uGa_{1-u}As_{1-u}$ region can be the top region or top layer of the second confining region, such as when the second confining region is an upper confining region.

In one embodiment, a laser can include an active region having: one or more quantum wells having InGaAsP, and two or more quantum well bathers having $In_vGa_{1-v}As_{1-z}P_z$. Here, z can range from about 0.30 to about 0.60 or as described herein. In one aspect, v can be less than or about 0.10, such as ranging from about 0 to about 0.1, or from about 0.001 to about 0.1, or from about 0.01 to about 0.09, or from about 0.05 to about 0.07, or about 0.06. Also, the In can be present in a trace amount. Also, the two or more quantum well bathers can bound the one or more quantum wells as is common so that a barrier is on the outside of each side of the active region with respect to the outside quantum well(s). The quantum wells can be configured as described herein. Also, the two or more quantum well barriers can have higher P and/or lower In than the one or more quantum wells. The higher amount of P in the bathers can have a wider band gap and/or the lower In can have a wider band gap. In one aspect, the barriers can include a trace amount of In, such as when In from a lower region floats on the surface of that region and becomes incorporated into the barrier. As such, the barrier can include some trace In in the GaAsP or GaPSb. Thus, the In can be incidental or trace as described herein. Also, consistent with other embodiments, the active region is devoid of Al, where the quantum wells and barriers are devoid of Al. Similarly, there may be trace amounts of In and As in the GaPSb barriers described herein.

In one embodiment, the active region having the quantum wells and quantum well barriers with InGaAsP can be configured substantially as described in connection to the active regions with one or more quantum wells having InGaAsP and two or more quantum well barriers having GaAsP. That is, the addition of In to the quantum well barriers can still be prepared in accordance with the parameters recited herein for the lasers having active regions without Al. Moreover, the active region having the quantum wells and quantum well barriers with InGaAsP can be designed as described in connection to the active regions with one or more quantum wells having InGaAsP and two or more quantum well barriers having GaAsP. The confining regions, such as the first and second confining regions as described herein, can be applied to the active region embodiment having the quantum wells and quantum well barriers with InGaAsP. Also, this embodiment can be used in any of the lasers described herein. Moreover, the lasers can be configured with the GaAs substrate. Furthermore, this active region embodiment can be included in lasers with mirrors as described herein or generally known in the art.

In one embodiment, the active region can be configured such that the In in the one or more quantum well barriers is present in an amount so that conduction band offset is about −0.2 ev and valence band offset is greater than or about 0.05 ev compared to two or more quantum well barriers having GaAsP that are devoid of In.

In one embodiment, the active regions described herein can be configured to be devoid of Al, or only include an incidental or trace amount (e.g., substantially devoid of Al), and by being substantially devoid of Al the laser can have increased reliability compared to lasers that include Al in the active region. Also, lasers having the active regions substantially devoid of Al can be faster than lasers with Al in the active regions. That is, the lasers of the present invention can be both faster and more reliable than lasers with Al in the active regions. The active regions of the present invention can be included in 28 Gb lasers (e.g., about 28 Gb or +/−3, 2, or 1 Gb) or faster.

In a specific example, an 850 nm or 808 VCSEL can include an active region with one or more quantum wells having InGaAsP, and two or more quantum well bathers having GaAsP bounding the one or more quantum wells, wherein the active region is devoid of Al. The compositions of the quantum wells and bathers can be as described herein, such as the optimum amounts of elements in the compositions.

In one embodiment, the laser can be configured with a semiconductor that inhibits lateral carrier diffusion going out under the oxide region or layers. This can be done using an oxide on a null with a thickness<250 A, optimally 180 A, or a damage implant outside the active region with a proton implant dose of from $1*e^{13}/cm^2$ to $1*e^{14}/cm^2$ preferably $5*e^{13}/cm^2$ so that the damage is in or near the quantum wells. In addition, quantum well intermixing through, for example, a high level $6*e^{15}/cm^2$ dose followed by an anneal at 825° C., or one other know intermixing techniques just outside the oxide aperture.

In one embodiment, quantum well barriers made from tensile GaPSb can provide suitable band offsets compared to InGaAs quantum wells. In addition, by using an InGaP n-doped injection layer on one side of the active region having the GaPSb barriers and a graded AlInGaP p-side confining region on the other side, tunnel injection lasers can be achieved offering extremely high speeds, such as 56 Gb+/−8 Gb.

In one embodiment, the quantum well bathers are devoid of aluminum. In one aspect, the active region is devoid of InGaP quantum well barriers. However, InGaP quantum well bathers may be modified to include As or Sb so as to be sufficiently thin for tunneling in both bands.

In one embodiment, a method of designing the laser described herein can be implemented. For example, the method can be implemented using a computing system having a memory device with computer-executable instructions that perform a design function to design aspects of the laser based on given parameters that are input into the computing device. However, the method can be performed with other well-known designing implementations. Computing systems having memory devices that can be used in performing calculations are well known, and can include laptops, desktops, tablets, handheld devices, or the like. The method can include: calculating the one or more quantum wells have a composition $In_xGa_{1-x}As_{1-y}P_y$ according to Equation 1: y=0.0018567*QW+1.18*x−0.14373, wherein QW, x, and y are as described herein. Here, two of these variables can be set in order to determine the third variable. Variations in the parameters and simulation can yield an optimal or desirable design for the quantum wells. The active region can be further designed by selecting values for the quantum well barriers.

In one embodiment, the semiconductor device, such as having the active region having quantum wells and quantum well bathers as well as the other semiconductor regions can be prepared by molecular beam epitaxy (MBE) or in MOCVD reactors. In one aspect, the active region or whole device having semiconductor layers of a VCSEL can be produced with MBE or MOCVD. Additionally, the VCSELs can be prepared by methods that are similar to MBE, such as GSMBE (gas source MBE) and MOMBE (metalorganic MBE) or the like.

Various aspects of the present invention will now be illustrated in the context of a VCSEL. However, those skilled in the art will recognize that the features of the present invention can be incorporated into other light-emitting semiconductor devices that have an active region.

Figure 1:
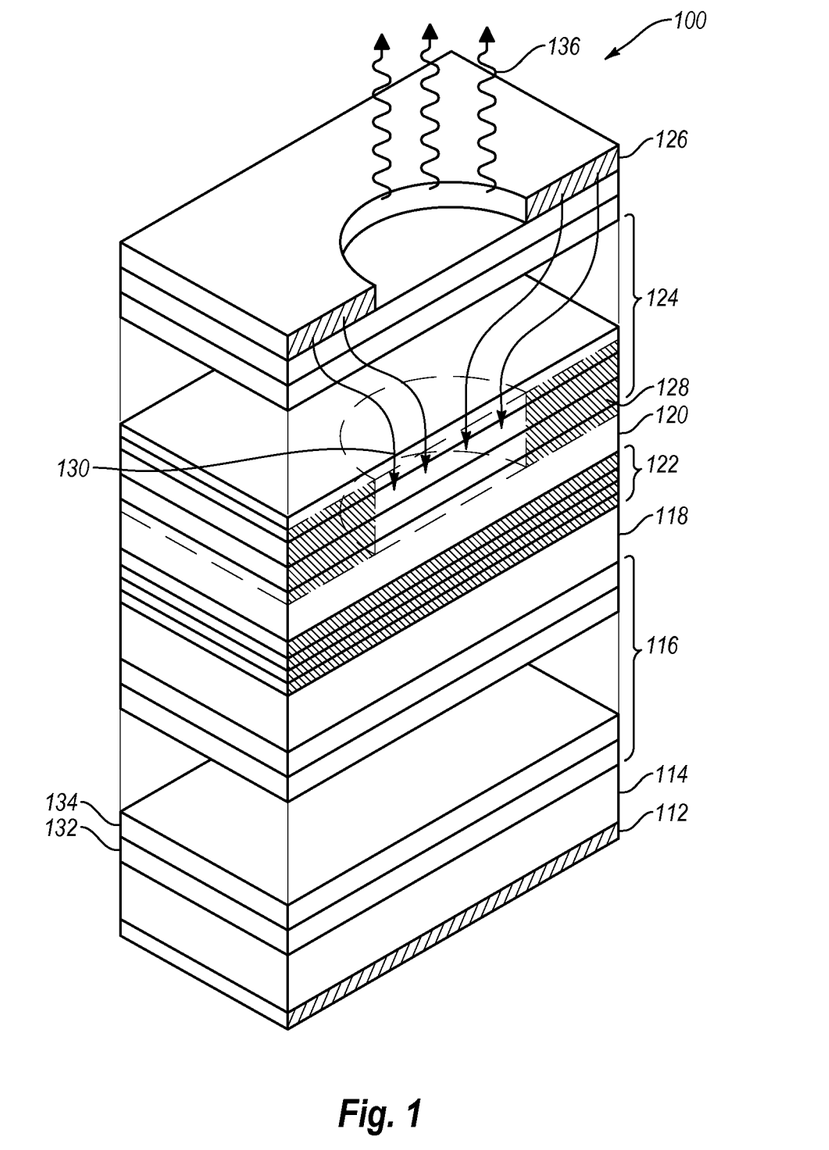
FIG. 1 is a schematic of an embodiment of a VCSEL operating environment.

FIG. 1 shows a planar, current-guided, VCSEL 100 having periodic layer pairs for upper mirror stack 124 and bottom mirror stack 116. A GaAs substrate 114 is formed on a bottom contact 112 and may optionally be doped with a first type of impurities (i.e., p-type or n-type dopant). A bottom mirror stack 116 is formed on the GaAs substrate 114 and a bottom confining region 118 is formed on bottom mirror stack 116. The bottom confining region 118 and a top confining region 120 sandwich an active region 122. An upper mirror stack 124 is formed on the top confining layer 120. A metal layer 126 forms a contact on a portion of upper mirror stack 124. However, other VCSEL configurations may also be utilized, and various other VCSEL layers or types of layers can be used. The electrical confining regions 120 and 118 can be configured as and function as mirror stacks 124 and 116. As such, the mirror stacks 124 and 116 can be omitted.

An isolation region 128 restricts the area of the current flow 130 through the active region 122. Isolation region 128 can be formed by an ion implantation and/or oxidation. Other isolation regions may be used as is known or developed for VCSEL devices. When included Mirror stacks 116 (bottom) and 124 (upper) can be a distributed Bragg reflector (DBR) stacks, and include periodic layers (e.g., 132 and 134). When the mirror stacks 116 and/or 118 are omitted, the confining regions 120 and 118 can include the periodic layers 132 and 134. Alternatively, the mirror stacks 116 and 124 can be configured as the confining regions described herein, and the confining regions 120 and 118 can be omitted.

Periodic layers 132 and 134 are typically AlGaAs of alternately high and low aluminum composition, but can be made from other III-V semiconductor materials. Mirror stacks 116 and 124 and/or confining regions 118 and 120 can be doped or undoped and the doping can be n-type or p-type depending on the particular VCSEL design. However, other types of VCSEL mirrors may be used.

Metal contact layers 112 and 126 can be ohmic contacts that allow appropriate electrical biasing of VCSEL 100. When VCSEL 100 is forward biased with a voltage on contact 126 different than the one on contact 112, active region 122 emits light 136, which passes through upper mirror stack 124. Those skilled in the art will recognize that other configurations of contacts can be used to generate a voltage across active region 122 and generate light 136, such as illustrated in FIG. 3.

Figure 2:
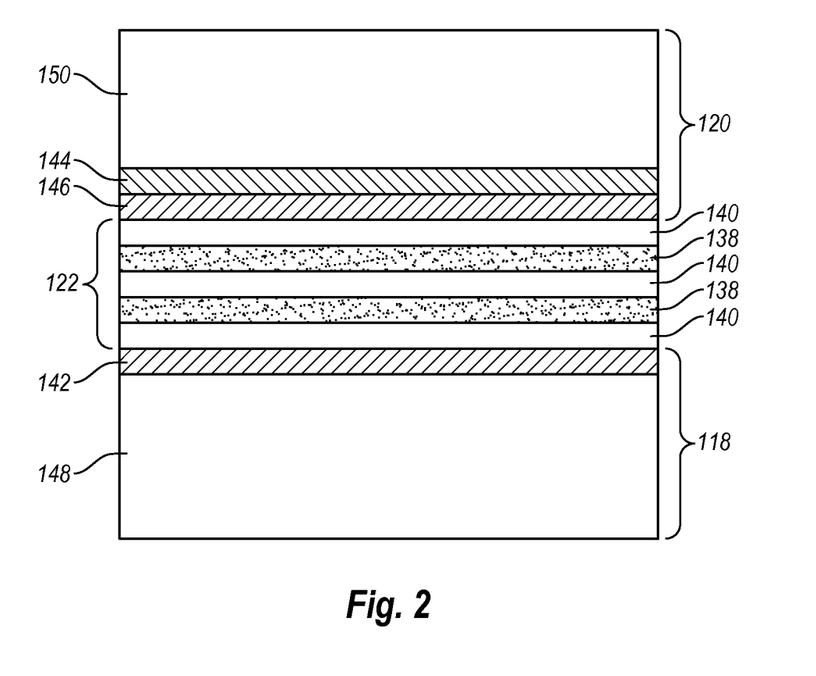
FIG. 2 is a schematic of an embodiment of a VCSEL active region layered semiconductor operating environment.

FIG. 2 illustrates the active region 122 and confining regions 118 (e.g., bottom or first) and 120 (e.g., top or second). Active region 122 is formed from one or more quantum wells 138 that are separated by quantum well barriers 140. The confining regions 118 and 120 may be configured as described herein.

Bottom confining region 118 may optionally include a thin nominally undoped region 142 that is positioned between the main portion of the confining region 148 and the active region 122.

Top confining region 120 may optionally include a ramp region 146 (e.g., compositional ramp confining layer) that is positioned between active region 122 and main portion of the confining region 144 (e.g., compositional consistent confining layer).

The ramp region 146 may be substituted with a nominally undoped region. Additionally, the top confining region 120 can include a top portion 150 that is an AlGaAs layer that has a high amount of Al and doping as described herein.

FIG. 3 includes a schematic of a portion 300 of an embodiment of a VCSEL. The VCSEL 300 can include a crystalline substrate 320, a first mirror region 316, a first confining region 314, a contact 328 associated with the first confining region 314, an active region 312, a compositional ramp confining layer 322, a second confining region 310, a second mirror region 318, a contact 324, and a laser output aperture 326 arranged in an operable VCSEL format. Any of these components besides the active region 312 can be prepared as is standard in the art or developed for VCSELs, such as in the incorporated references. The contact 326 in FIG. 3 shown to be located on the n-type material; however, the contact 326 can be connected at the substrate. Also, the contact 326 can be anywhere the material is n-type.

The following description of the VCSEL 300 can be used as an example; however, variations known in the art can be applied. The crystalline substrate 320 can be GaAs. The first mirror region 316 located on the GaAs substrate can have a plurality of first mirror layers having one or more indices of refraction. The first confining region 314 can be operably coupled to the active region 312. The contact 328 can be associated with the first confining region 314 so as to provide a path for electrons when the active region 312 is charged with electrical current. As described in more detail herein, the active region 312 can include one or more quantum wells bounded by one or more quantum well barrier layers. The second confining region 310 can be operably coupled with the active region 312, with the compositional ramp confining layer 322 therebetween. The second mirror region 318 can be located on the second confining region 310 and opposite of the active region 312, the second mirror region 318 having a plurality of second mirror layers having one or more indices of refraction. The contact 324 can be any type of electrical contact for the conduction of electricity for operation of the active region. The laser output aperture 326 can be arranged in an operable VCSEL format.

In one embodiment, a processes can be used for manufacturing a VCSEL having an active region with the features described herein. The process can include: (1) growing a first confining region; (2) growing one or more quantum well barriers; and growing one or more quantum wells between the quantum well barriers so that the quantum wells are bound by quantum well barriers to form the active region. After all of the quantum wells and quantum well barriers are grown, the process can include growing a second confining region on the active region. This can include growing the compositional ramp confining layer on the active region and then growing the compositional consistent confining. The process is generic for the growth of the active region having quantum well barriers and quantum wells. As such, the process can include: forming a quantum well barrier, forming a quantum well, and then forming a quantum well barrier, and repeating to formation of the quantum well and quantum well bather as desired so that the quantum wells have a quantum well barrier on each side and so that the active region has a quantum well barrier on each end. After the last quantum well barrier is formed, the second confining region can be formed. The compositional consistent confining layer can be AlGaAs or AlInGaP for example.

Figure 4:
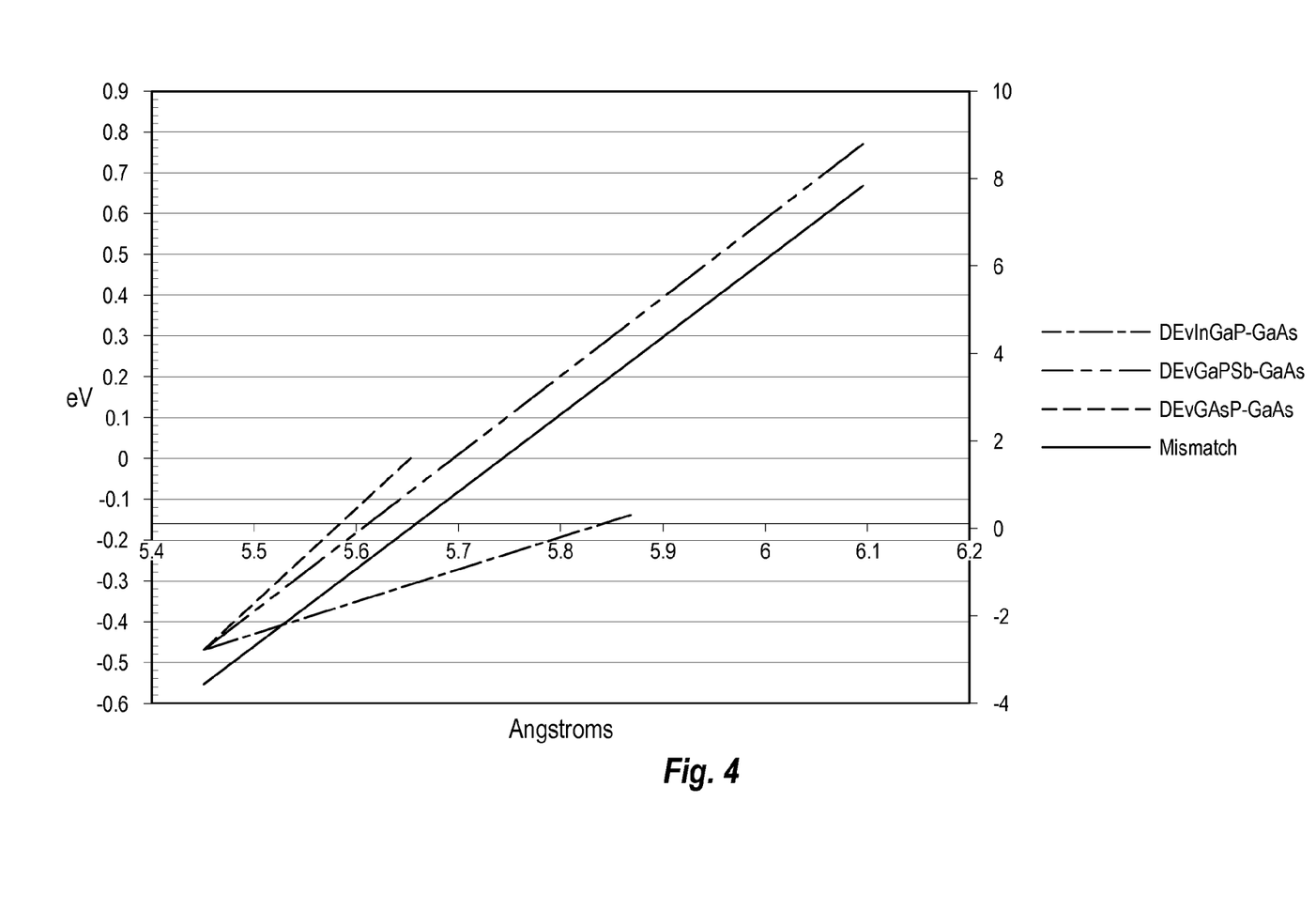
FIG. 4 is a graph showing the valence band offset versus lattice constant.

In one embodiment, in a high speed laser it can be important to distribute the carriers uniformly. To do this the magnitude of the valence band offsets need to be minimized, and the conduction band offsets need to be maximized. FIG. 4 includes a graph of data for valence band offsets to GaAs versus lattice constant, which shows 3 potential ternary barrier materials, GaAsP, GaPSb, and InGaP. "0" at a lattice constant of 5.65 Angstroms represents GaAs, and further negative offset implies more band offset.

InGaP has higher magnitude of valence band offset than the other materials except at the GaP endpoint, and because of this is too high it is not useful for a quantum well barrier. As shown, GaAsP is a good candidate for a quantum well barrier because it goes from 0 offset at GaAs to a large offset at GaP. GaPSb is also a good candidate because of its relatively low values of valence band offsets.

Figure 5:
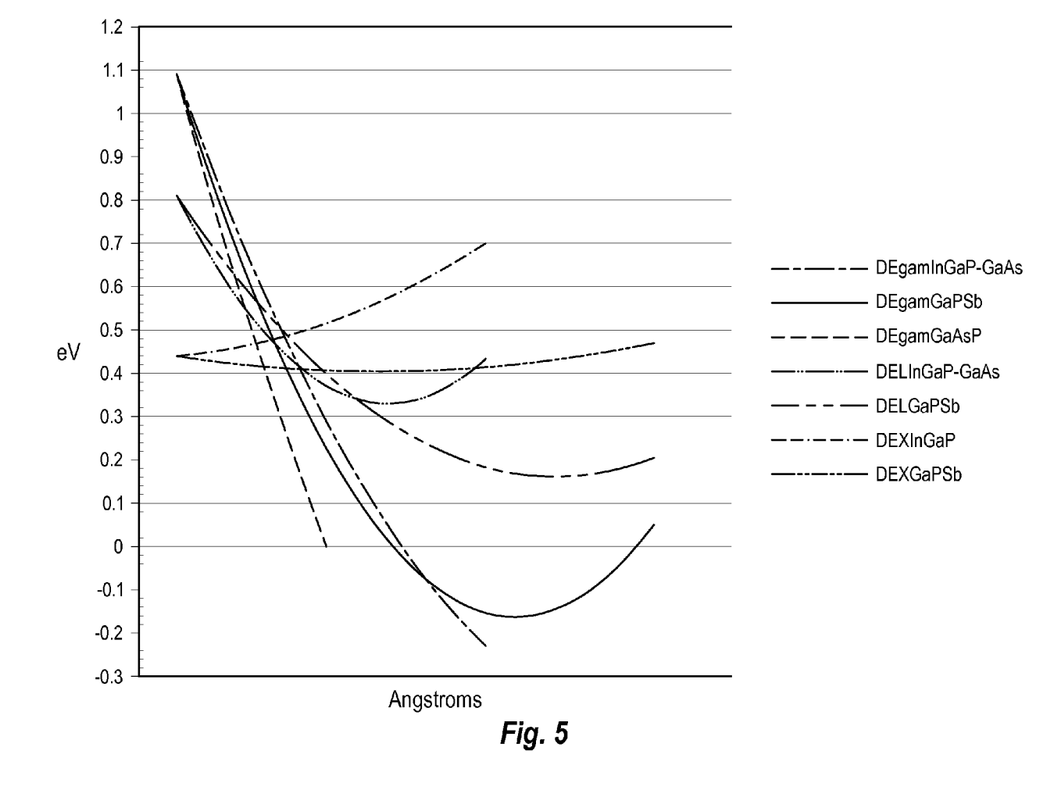
FIG. 5 is a graph showing conduction band offset as a function of lattice constant for various bands.

FIG. 5 includes a graph of data for conduction band offsets, which shows the band offsets for various valleys of the GaAsP, GaPSb, and InGaP quantum well barrier materials. GaAsP has the lowest conduction band offset for the gamma valley, and requires the most tensile strain to achieve reasonable offset. Unfortunately large strain reduces the band offset in a manner not reflected here and the large strain required gives a larger valence band offset than desired. Even so, with a phosphorus content of about 40-50%, GaAsP barriers can be used. GaPSb barriers give both a high conduction band offset and a low valence band offset at slightly tensile lattice constants where the strain effects are low. This makes GaPSb an ideal candidate for a quantum well barrier material.

Additionally, in devices of the most interest InGaAs quantum wells are used with or without wings at the interface with the quantum well barriers. Using InGaAs for the quantum wells further enhances the conduction band offset substantially as well as only slightly increasing the valence band offset. To optimize this further phosphorus can be added to the quantum well making it InGaAsP. For a given geometry and wavelength, the addition of P to the quantum well decreases the valence band offset and enhances the conduction band offset. This can be useful with GaAsP barriers, but may be useful with other barrier materials such as GaPSb. To compare to the AlGaAs system the extremes of the conduction and valence band offsets are marked by the x-axis crossings.

Additionally, GaPSb has a miscibility gap ranging from 1% to 99%. In spite of this, the present invention can be created by growing the GaPSb material using non-equilibrium techniques such as MBE and MOCVD and using a low V/III so that the group V elements are held in place immediately without chance to segregate into separate phases. The active regions described herein with GaPSb quantum well barriers have been prepared to achieving the GaPSb—InGaAs active regions. The InGaAs quantum wells can have about 10% indium, and the barriers can have about 20% Sb that are about 25-37 Angstroms thick. In one aspect, 31 Angstrom GaPSb barriers can be used. In another aspect, 37 Angstrom GaPSb bathers can be used. The Sb surfactant nature can be avoided using a low V/III. Interface issues with InGaP—InGaAs interfaces can be avoided with the GaPSb barriers, and the offsets are suitable without adding P to the quantum well making growth of the GaPSb—InGaAs active regions comparatively simpler.

The barrier and well combinations of GaPSb and InGaAs (P) can be an optimal combination for short wavelength (e.g., 850 nm) tunnel injection lasers. However, the GaAsP barrier and InGaAsP wells can be configured as tunnel injection lasers as described herein. AlGaAs—GaAs—InGaAs(P) may be another active region option. To make a tunnel injection laser with the two primary candidates, the n-side injection layer (e.g., n-doped confining region) can be InGaP. This provides a lower energy level for the electrons being injected than the second level or continuum of the wells.

Figure 6:
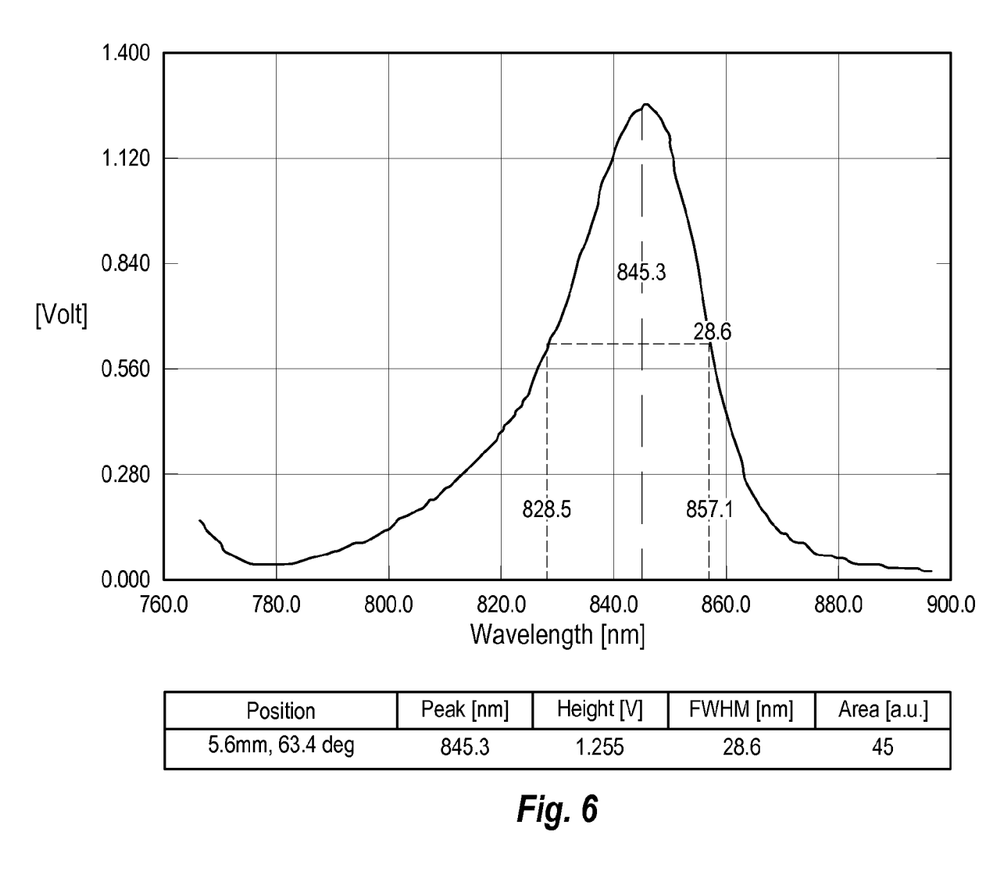
FIG. 6 is a graph showing the first photoluminescence spectrum for an active region having 37 Angstrom InGaAs quantum wells with GaPSb quantum well bathers.

FIG. 6 includes a graph illustrating the photoluminescence of an active region having InGaAs quantum wells with GaPSb barriers. Here, the GaPSb barriers are about 25 Angstroms. The graph shows the peak of wavelength being at about 845.3, which can be tuned as desired.

Figure 7:
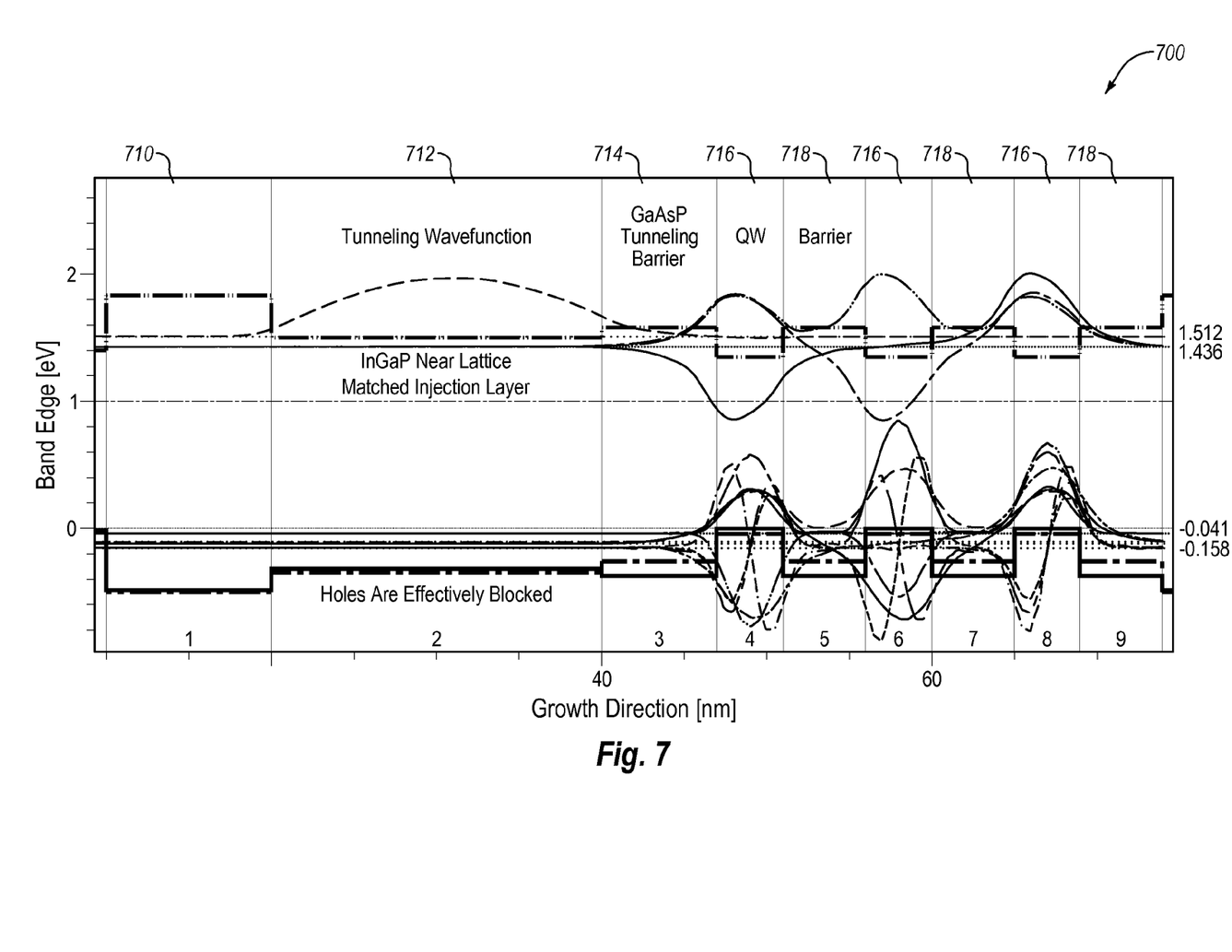
FIG. 7 shows a band versus position diagram for a tunnel injection laser using GaAsP quantum well bathers and InGaAsP quantum wells with an InGaP n injection layer.

FIG. 7 shows data for a tunnel injection laser 700 active region having GaAsP quantum well barriers 714 and 718 and InGaAsP quantum wells 716 via Simulase simulation. The laser 700 also includes a mirror region 710 and an InGaP n-doped confining region. Also, the first quantum well bather 714 is noted to be a GaAsP tunneling barrier as shown by the data. The GaAsP—InGaAsP tunnel injection active region shows the level at which the electrons are injected and the lowest levels. In this structure, the next higher levels in the quantum wells are unconfined. The valence band simulation shows many hole levels, including excited levels, with no leakage into the left side of the device because the valence band offset using InGaAsP quantum well, with the InGaP confining layer is sufficient to prevent it. In view of FIG. 7, it can be expected that the GaPSb quantum well bather and InGaAs quantum well active region can be made superior to the data shown in FIG. 7.

Figure 8:
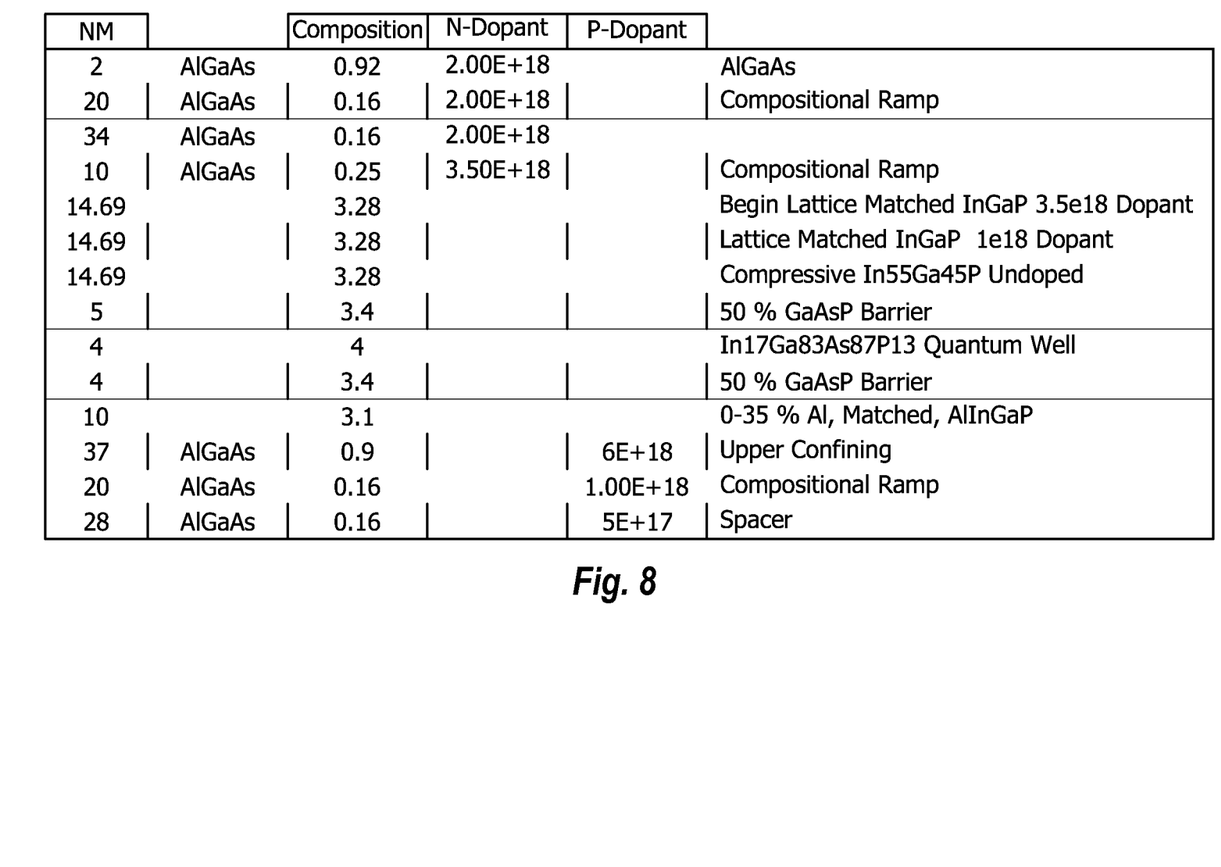
FIG. 8 shows a table with details of an embodiment of an active region for a tunnel injection laser using GaAsP quantum well barriers and InGaAsP quantum wells. The column labeled composition is the aluminum mole fraction when AlGaAs is used, and the index of refraction for other materials (i.e., not AlGaAs).

FIG. 8 shows an example of a structure of an embodiment of a tunnel injection laser having GaAsP quantum well bathers and InGaAsP quantum wells. Each active region can include the InGaAs quantum well and GaAsP barrier repeated, such as 2, 3, 4, or 5 times. Another bather layer is shown on the other side of the end quantum well so that the active region includes barriers on each side. The column labeled "Composition" is the aluminum mole fraction when AlGaAs is used as the material, and identifies the index of refraction for other materials (i.e., not AlGaAs).

Figure 9:
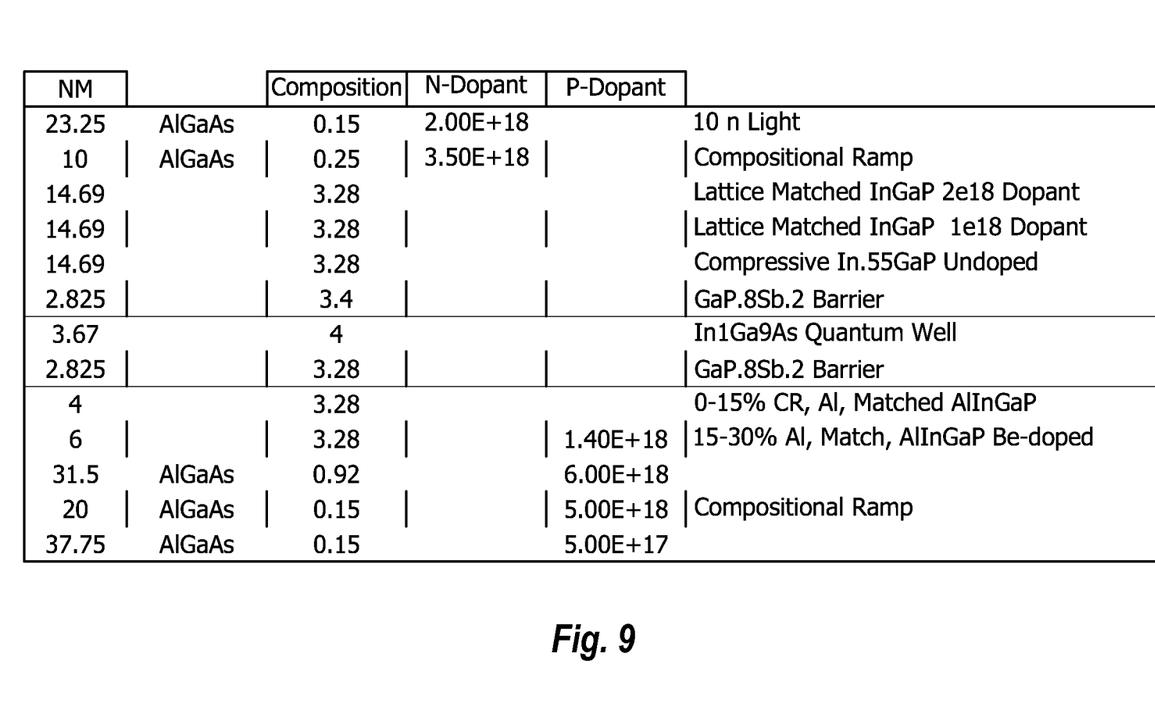
FIG. 9 shows a table with details of an embodiment of an active region for a tunnel injection laser using GaPSb quantum well barriers and InGaAs(P) quantum wells.

FIG. 9 shows an example of a structure of an embodiment of a tunnel injection laser having GaPSb quantum well barriers and InGaAs quantum wells. Each active region can include the InGaAs quantum well and GaPSb barrier repeated, such as 2, 3, 4, or 5 times. Another barrier layer is shown on the other side of the end quantum well so that the active region includes barriers on each side. The column labeled "Composition" is the aluminum mole fraction when AlGaAs is used as the material, and identifies the index of refraction for other materials (i.e., not AlGaAs).

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The present disclosure is to be limited only by the terms of the appended claims, along with the full scope of equivalents to which such claims are entitled. It is to be understood that this disclosure is not limited to particular methods, reagents, compounds, compositions, or biological systems, which can, of course, vary. It is also to be understood that the terminology used herein is for the purpose of describing particular embodiments only, and is not intended to be limiting.

The herein-described subject matter sometimes illustrates different components contained within, or connected with, different other components. It is to be understood that such depicted architectures are merely exemplary, and that, in fact, many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality, and any two components capable of being so associated can also be viewed as being "operably couplable" to each other to achieve the desired functionality. Specific examples of operably couplable include, but are not limited to, physically mateable and/or physically interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third, and upper third, etc. As will also be understood by one skilled in the art, all language such as "up to," "at least," and the like include the number recited and refer to ranges which can be subsequently broken down into subranges as discussed above. Finally, as will be understood by one skilled in the art, a range includes each individual member. Thus, for example, a group having 1-3 units refers to groups having 1, 2, or 3 units. Similarly, a group having 1-5 units refers to groups having 1, 2, 3, 4, or 5 units, and so forth.

The present application cross-references patent documents: US 2011/0049471, US 2012/0236891, US 2012/0236892, U.S. Pat. Nos. 7,110,427, and 7,920,612, which are incorporated herein by specific reference in their entirety.

The invention claimed is:

1. A laser active region comprising:
one or more quantum wells; and
one or more quantum well barriers having GaPSb bounding each side of each of the one or more quantum wells;
wherein the quantum well barriers define the boundaries of each of the one or more quantum wells.

2. The laser active region of claim 1, wherein the quantum well barrier is $GaP_{1-w}Sb_w$, where w ranges from about 0.12 to about 0.25 mole fraction.

3. The laser active region of claim 2, wherein w is about 0.18 mole fraction.

4. The laser active region of claim 1, wherein the quantum well barrier has a thickness of from about 20 Angstroms to about 50 Angstroms.

5. The laser active region of claim 4, wherein the quantum well barrier thickness is about 25 Angstroms.

6. The laser active region of claim 1, wherein the one or more quantum wells include InGaAs.

7. The laser active region of claim 1, wherein the one or more quantum wells include InGaAsP.

8. A laser having the laser active region of claim 1.

9. The laser of claim 8 capable of emitting light having a wavelength of about 850 nm or +/−150 nm.

10. A vertical cavity surface-emitting laser (VCSEL) having the laser active region of claim 1.

11. A tunneling laser having the laser active region of claim 1.

12. A laser comprising:
one or more quantum wells having InGaAs; and
a quantum well barrier having GaPSb bounding each side of each of the one or more quantum wells.

13. The laser of claim 12, wherein the quantum well barrier is $GaP_{1-w}Sb_w$, where w ranges from about 0.12 to about 0.25 mole fraction.

14. The laser of claim 12, wherein the quantum well barrier has a thickness of from about 20 Angstroms to about 50 Angstroms.

15. The laser of claim 12, wherein the one or more quantum wells have at least a trace of P.

16. The laser of claim 12, comprising:
a n-doped confining region operably coupled with a first side of an active region having the one or more quantum wells and quantum well barriers, the n-doped confining region having AlInGaP; and
a p-doped confining region operably coupled to a second side of the active region and having AlInGaP.

17. The laser of claim 16, wherein the p-doped confining region includes a compositional ramp confining region adjacent to the active region.

18. A method of manufacturing the laser active region of claim 1, the method comprising:
growing the GaPSb quantum well barrier using a non-equilibrium technique with a group V/III element ratio sufficient that the group V elements are held in place without the group V and group III elements segregating into separate phases.

19. The method of claim 18, wherein the GaPSb quantum well barrier is grown to have one or more of:
$GaP_{1-w}Sb_w$, where w ranges from about 0.12 to about 0.25 mole fraction; or
a thickness of from about 20 Angstroms to about 50 Angstroms.

* * * * *